(12) United States Patent
Tang et al.

(10) Patent No.: US 12,592,697 B1
(45) Date of Patent: Mar. 31, 2026

(54) METHOD OF GENERATING IN-PHASE AND QUADRATURE-PHASE CLOCK SIGNALS

(71) Applicant: QUALCOMM Incorporated, San Diego, CA (US)

(72) Inventors: Yongjian Tang, San Diego, CA (US); Xiaohua Kong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 15 days.

(21) Appl. No.: 18/957,167

(22) Filed: Nov. 22, 2024

(51) Int. Cl.
*H03K 17/687* (2006.01)
*G06F 1/08* (2006.01)
*H03F 3/45* (2006.01)

(52) U.S. Cl.
CPC ........... *H03K 17/6872* (2013.01); *G06F 1/08* (2013.01); *H03F 3/45475* (2013.01)

(58) Field of Classification Search
CPC .... H03K 17/6872; G06F 1/08; H03F 3/45475
See application file for complete search history.

(56) References Cited

U.S. PATENT DOCUMENTS

| | | | | |
|---|---|---|---|---|
| 7,659,754 | B2 * | 2/2010 | Thiele .............. | H03K 17/04123 |
| | | | | 327/437 |
| 9,329,453 | B1 * | 5/2016 | Hsieh ................. | H03M 1/1245 |

| | | | | |
|---|---|---|---|---|
| 9,473,074 | B1 * | 10/2016 | Blom .................. | H03F 3/45192 |
| 10,072,969 | B2 * | 9/2018 | Rhoads .................. | G01H 13/00 |
| 10,075,154 | B1 * | 9/2018 | Hsieh .................. | H03K 17/007 |
| 12,510,605 | B2 * | 12/2025 | Haines ....................... | G01R 31/52 |
| 12,510,921 | B2 * | 12/2025 | Choi ......................... | G06F 1/08 |
| 2006/0001493 | A1 * | 1/2006 | Harms .................... | H03F 3/082 |
| | | | | 330/308 |
| 2018/0033815 | A1 * | 2/2018 | Chalmers, Jr. ......... | H03G 3/001 |
| 2020/0186105 | A1 * | 6/2020 | Kanagal Ramesh ... | H03F 3/082 |
| 2022/0294429 | A1 * | 9/2022 | Coban ................. | H03F 3/45475 |
| 2024/0219953 | A1 * | 7/2024 | Choi ......................... | G06F 1/06 |

* cited by examiner

Primary Examiner — Menatoallah Youssef
Assistant Examiner — Khareem E Almo
(74) Attorney, Agent, or Firm — Loza & Loza, LLP

(57) ABSTRACT

A clock signal generator, including: an in-phase clock generating circuit, comprising: an inverter configured to invert an input clock signal to generate a substantially square wave voltage; and a first transimpedance amplifier (TIA) configured to generate an in-phase clock signal based on the substantially square wave voltage; and a quadrature-phase clock generating circuit comprising: a load capacitor; a switched integrator configured to integrate the input clock signal to generate a substantially triangular wave voltage across the load capacitor; and a second transimpedance amplifier (TIA) configured to generate a quadrature-phase clock signal based on the substantially triangular wave voltage.

20 Claims, 5 Drawing Sheets

100

200

METHOD OF GENERATING IN-PHASE AND QUADRATURE-PHASE CLOCK SIGNALS

FIELD

This disclosure relates generally to the generation of clock signals, and in particular, to a clock signal generator and related method of generating in-phase (I) and quadrature-phase (Q) clock signals.

BACKGROUND

A serializer-deserializer (SERDES) communication system may perform data transmission using half-rate clock scheme from a data transmitter to a data receiver via a communication channel. For example, at a data transmitter, the full-rate transmit data may be generated by combining half-rate in-phase (I) data and half-rate quadrature-phase (Q) data, which are clocked by an in-phase (I) half-rate clock signal CLK-I and a quadrature-phase (Q) half-rate clock signal CLK-Q, respectively.

At a data receiver, the received signal is sampled by an in-phase (I) half-rate clock signal CLK-I and a quadrature-phase (Q) half-rate clock signal CLK-Q. The phase difference between the in-phase (I) clock signal CLK-I and the quadrature-phase (Q) clock signal CLK-Q should be substantially 90 degrees for accurate I/Q combination at a data transmitter and accurate I/Q sampling at a data receiver.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a clock signal generator. The clock signal generator including: an in-phase clock generating circuit, comprising: an inverter configured to invert an input clock signal to generate a substantially square wave voltage; and a first transimpedance amplifier (TIA) configured to generate an in-phase clock signal based on the substantially square wave voltage; and a quadrature-phase clock generating circuit comprising: a load capacitor; a switched integrator configured to integrate the input clock signal to generate a substantially triangular wave voltage across the load capacitor; and a second transimpedance amplifier (TIA) configured to generate a quadrature-phase clock signal based on the substantially triangular wave voltage.

Another aspect of the disclosure relates to a method of generating quadrature clock signals. The method includes inverting an input clock signal to generate an in-phase clock signal; integrating the input clock signal to generate a triangular wave voltage; and converting the triangular wave voltage into a square wave to generate a quadrature-phase clock signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
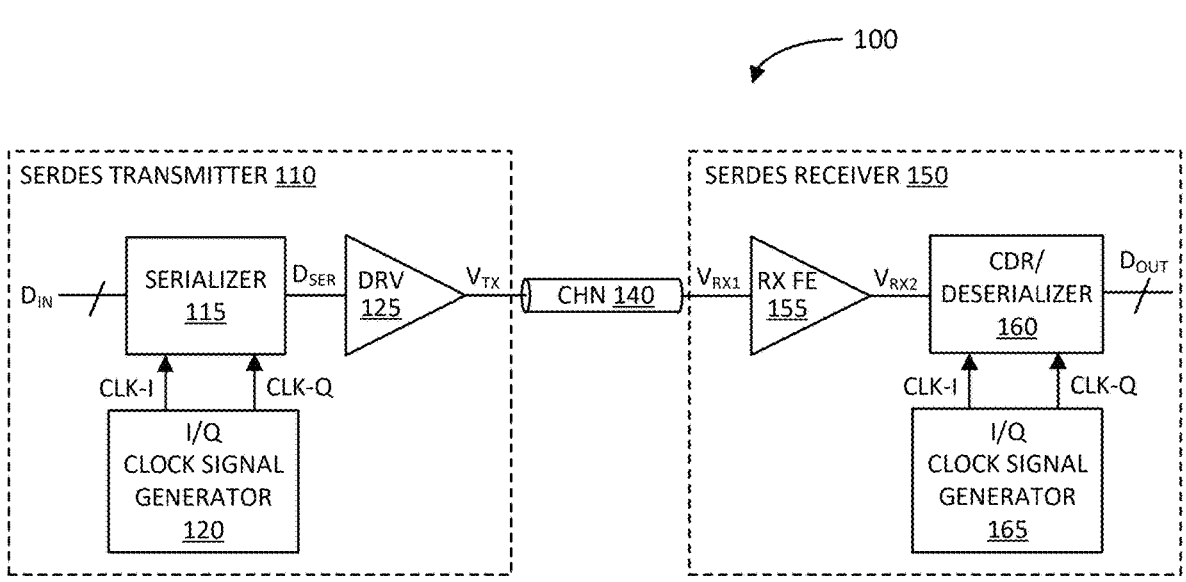
FIG. 1 illustrates a block diagram of an example serializer/deserializer (SERDES) communication system in accordance with an aspect of the disclosure.

FIG. 1 illustrates a block diagram of an example serializer/deserializer (SERDES) communication system 100 in accordance with an aspect of the disclosure. The SERDES communication system 100 includes a SERDES transmitter 110, a SERDES receiver 150, and a channel (CHN) communication medium 140 coupling the SERDES transmitter 110 to the SERDES receiver 150. In this example, the SERDES communication system 100 is shown to include a single unidirectional data lane. However, it shall be understood that the SERDES communication system 100 may include a set of unidirectional and/or bidirectional data lanes.

The SERDES transmitter 110 includes a serializer 115, a driver (DRV) 125, and a quadrature (I/Q) clock signal generator 120. The serializer 115 is configured to receive input parallel data Dm and serialize the input parallel data Dm including performing I/Q data combination to generate serial data $D_{SER}$. The serializer 115 performs I/Q combination of the data based on an in-phase (I) clock signal CLK-I and a quadrature-phase clock signal CLK-Q generated by the quadrature (I/Q) clock signal generator 120. The driver 125 is configured to power amplify the serial data $D_{SER}$ to generate a transmit data signal $V_{TX}$ for transmission to the SERDES receiver 150 via the channel communication medium 140.

The SERDES receiver 150 includes a receiver front-end (FE) 155, a clock and data recovery (CDR)/deserializer 160, and a quadrature (I/Q) clock signal generator 165. The receiver front-end 155 is configured to receive the transmit data signal $V_{TX}$ after propagating via the channel communication medium 140, which is referred to herein from the perspective of the SERDES receiver 150 as a first receive data signal $V_{RX1}$. The receiver front-end 155 is further configured to amplify and equalize the first receive data signal $V_{RX1}$ to generate a second receive data signal $V_{RX2}$ (e.g., to compensate for channel effects on the first receive data signal $V_{RX1}$). The CDR/deserializer 160 is configured to recover and deserialize the data from the second receive data signal $V_{RX2}$ based on an in-phase (I) clock signal CLK-I and a quadrature-phase (Q) clock signal CLK-Q generated by the quadrature (I/Q) clock signal generator 165 to generate output parallel data $D_{OUT}$.

Figure 2:
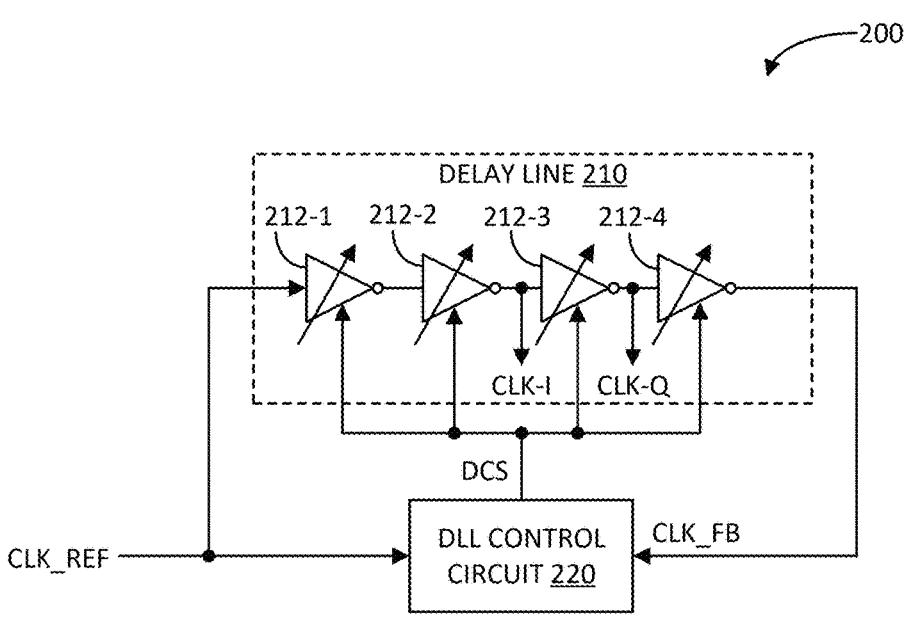
FIG. 2 illustrates a block diagram of an example quadrature (I/Q) clock signal generator in accordance with another aspect of the disclosure.

FIG. 2 illustrates a block diagram of an example quadrature (I/Q) clock signal generator 200 in accordance with another aspect of the disclosure. The quadrature (I/Q) clock signal generator 200 may be an example implementation of any of the quadrature (I/Q) clock signal generators 120 and 165 of SERDES communication system 100. As discussed as follows, the quadrature (I/Q) clock signal generator 200 uses a delay lock loop (DLL) to generate an in-phase (I) clock signal and a quadrature-phase (Q) clock signal.

In particular, the quadrature (I/Q) clock signal generator 200 includes a delay line 210 and a delay lock loop (DLL) control circuit 220. The delay line 210, in turn, includes a set of cascaded current-starved inverters 212-1 to 212-4 (e.g., four (4) shown, in this example, but could include other number of cascaded current-starved inverters). The delay line 210 and the DLL control circuit 220 may be both configured to receive a reference clock signal CLK_REF. The delay line 210 is configured to generate a feedback clock signal CLK_FB based on (e.g., by successively delaying) the reference clock signal CLK_REF. The DLL control circuit 220 is configured to generate a delay control signal DCS to control the delay effectuated on the reference clock signal CLK_REF by each of the current-starved inverters 212-1 to 212-4 so that the phase of the feedback clock signal CLK_FB is substantially the same as (e.g., phase locked to) the phase of the reference clock signal CLK_REF.

As the reference and feedback clock signals CLK_REF and CLK_FB have substantially the same phase, the delay effectuated by the delay line 210 is one period or 360 degrees. Accordingly, since there are four (4) current-starved inverters 212-1 to 212-4 configured to apply substantially the same delay to the reference clock signal CLK_REF, each of the current-starved inverters 212-1 to 212-4 effectuates substantially a 90-degree phase shift of the reference clock signal CLK_REF. Thus, two adjacent current-starved inverters 212-1 to 212-4 (e.g., 212-2 and 212-3) may generate the in-phase (I) clock signal CLK-I and the quadrature-phase (Q) clock signal CLK-Q, respectively.

A drawback of the DLL-based quadrature (I/Q) clock signal generator 200 is that calibration or phase locking is typically required due to variation in process corners and temperature. Further, the DLL-based quadrature (T/Q) clock signal generator 200 may be difficult to frequency scale as it requires additional tuning of the current-starved inverters 212-1 to 212-4.

Figure 3:
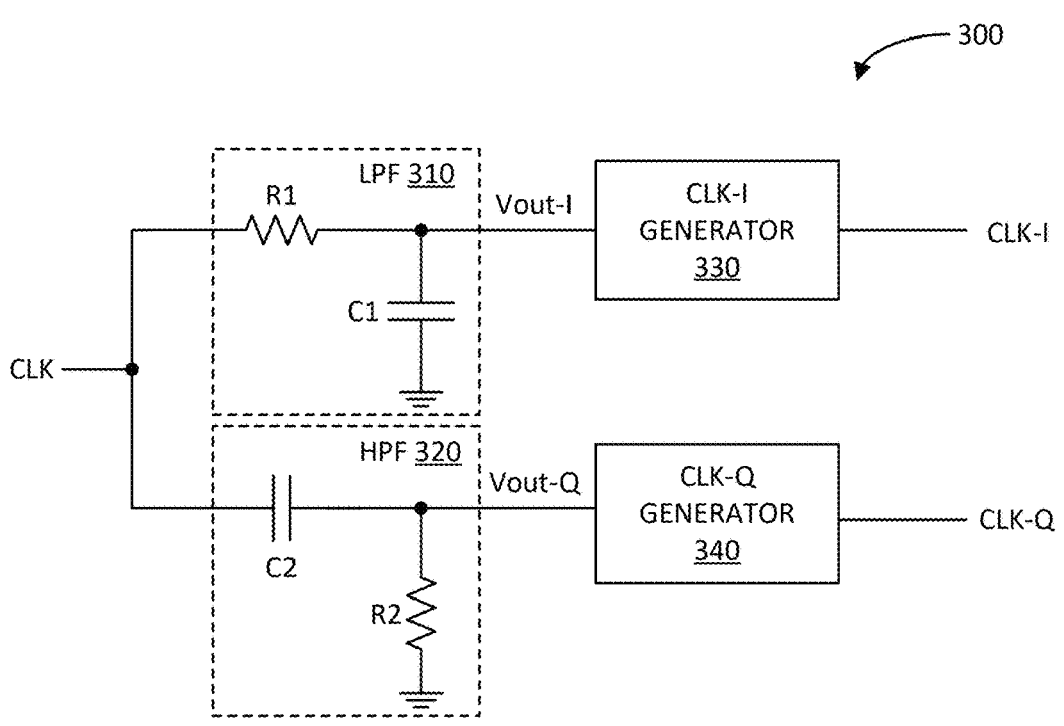
FIG. 3 illustrates a block diagram of another example quadrature (I/Q) clock signal generator in accordance with another aspect of the disclosure.

FIG. 3 illustrates a block diagram of another example quadrature (I/Q) clock signal generator 300 in accordance with another aspect of the disclosure. The quadrature (I/Q) clock signal generator 300 may be an example implementation of any of the quadrature (I/Q) clock signal generators 120 and 165 of SERDES communication system 100. As discussed as follows, the quadrature (I/Q) clock signal generator 300 uses a polyphase filter to generate an in-phase (I) clock signal and a quadrature-phase (Q) clock signal.

In particular, the quadrature (I/Q) clock signal generator 300 includes a low pass filter (LPF) 310, a high pass filter (HPF) 320, an in-phase (I) clock signal generator 330, and a quadrature-phase (Q) clock signal generator 340. The LPF 310, in turn, includes a series resistor R1 coupled to a shunt capacitor C1. The HPF 320, in turn, includes a series capacitor C2 coupled to a shunt resistor R2. The LPF 310 and the HPF 320 are configured to receive an input clock signal CLK.

The LPF 310 is configured to generate an in-phase (I) output voltage Vout-I based on the input clock signal CLK. The HPF 320 is configured to generate a quadrature-phase (Q) output voltage Vout-Q based on the input clock signal CLK. The in-phase (I) output voltage Vout-I is phase shifted by substantially +45 degrees with respect to the input clock signal CLK. The quadrature-phase (I) output voltage Vout-Q is phase shifted by substantially −45 degrees with respect to the input clock signal CLK. Thus, the phase difference between the in-phase (I) output voltage Vout-I and the quadrature-phase (Q) output voltage Vout-Q is substantially 90 degrees.

The in-phase (I) clock signal generator 330 is configured to generate an in-phase (I) clock signal CLK-I based on the in-phase (I) output voltage Vout-I (e.g., by converting Vout-I into a square wave). The quadrature-phase (Q) clock signal generator 340 is configured to generate a quadrature-phase (Q) clock signal CLK-Q based on the quadrature-phase (Q) output voltage Vout-Q (e.g., by converting Vout-Q into a square wave).

A drawback of the polyphase-filter-based quadrature (I/Q) clock signal generator 300 is that it may be difficult to frequency scale as it requires additional tuning of the LPF 310 and HPF 320. Another drawback of the polyphase-filter-based quadrature (I/Q) clock signal generator 300 is that it typically consumes a relatively large integrated circuit (IC) footprint due to the resistors R1/R2 and capacitors C1/C2.

Figure 4:
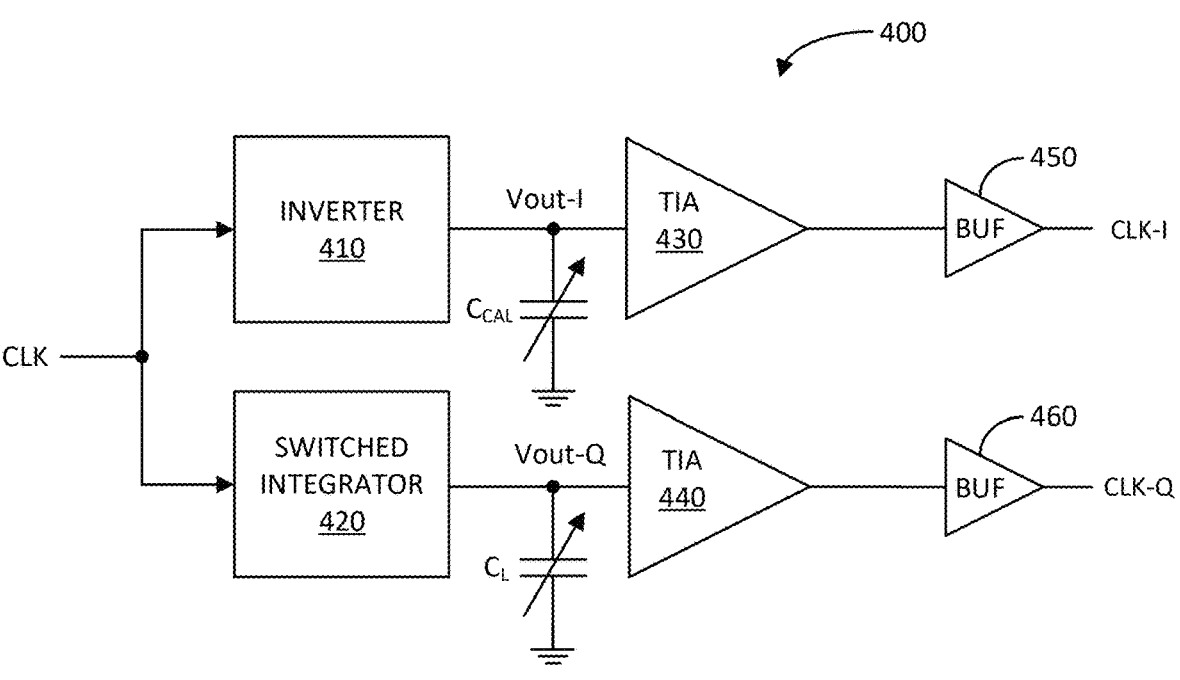
FIG. 4 illustrates a block diagram of another example quadrature (I/Q) clock signal generator in accordance with another aspect of the disclosure.

FIG. 4 illustrates a block diagram of another example quadrature (I/Q) clock signal generator 400 in accordance with another aspect of the disclosure. The quadrature (I/Q) clock signal generator 400 may be an example implementation of any of the quadrature (I/Q) clock signal generators 120 and 165 of SERDES communication system 100.

The quadrature (I/Q) clock signal generator 400 includes an inverter 410, a calibration capacitor $C_{CAL}$ (e.g., which may have a variable capacitance), a first transimpedance amplifier (TIA) 430, and a first buffer 450. The quadrature (I/Q) clock signal generator 400 further includes a switched integrator 420, a load capacitor $C_L$ (e.g., which may have a variable capacitance), a second transimpedance amplifier (TIA) 440, and a second buffer 460. Both the inverter 410 and the switched integrator 420 are configured to receive an input clock signal CLK.

The inverter 410 is configured to generate a substantially square wave in-phase (I) voltage Vout-I based on (e.g., by inverting) the input clock signal CLK. The switched integrator 420 and load capacitor $C_L$ are collectively configured to generate a substantially triangular wave quadrature-phase (Q) voltage Vout-Q based on (e.g., by integrating) the input clock signal CLK. The phase difference between the in-phase (I) voltage Vout-I and the quadrature-phase (Q) voltage Vout-Q is substantially 90 degrees. The calibration capacitor $C_L$ may need some tuning to ensure that such phase difference is substantially 90 degrees to account for some delay mismatch between the inverter 410 and the switched integrator 420. As the load capacitor $C_L$ is for performing an integration operation, whereas the calibration capacitor $C_{CAL}$ is for tuning for delay mismatch, the load capacitor $C_L$ may have a capacitance greater than the capacitance of the calibration capacitor $C_{CAL}$.

The first TIA 430 is configured to amplify the in-phase (I) voltage Vout-I to generate the in-phase (I) clock signal CLK-I at the output of the first buffer 450 (e.g., which may be implemented as a first set of one or more cascaded inverters). The second TIA 440 is configured to amplify and substantially square wave the triangular-wave quadrature-phase (Q) voltage Vout-Q to generate the quadrature-phase (Q) clock signal CLK-Q at the output of the second buffer 460 (e.g., which may be implemented as a second set of one or more cascaded inverters). The first TIA 430 may be employed to substantially delay match the in-phase (I) clock signal generating path with the quadrature-phase (Q) clock signal generating path.

The quadrature (I/Q) clock signal generator 500 has advantageous over the quadrature (I/Q) clock signal generators 300 and 400. For example, the quadrature (I/Q) clock signal generator 500 may be frequency scalable by adjusting the load capacitor charging and discharging current generated by the switched integrator 420. For example, if the frequency scaling is to reduce the frequency of the input clock signal by half, the load capacitor charging and discharging current may also be reduced by half; or the capacitance of the load capacitor $C_L$ may be doubled. Similarly, if the frequency scaling is to increase the frequency of the input clock signal by a factor of two (2), the load capacitor charging and discharging current may also be increased by a factor of two (2); or the capacitance of the load capacitor $C_L$ may be halved. The quadrature (I/Q) clock signal generator 500 may also be tunable for process corner and temperature variations, for example, by tuning the calibration capacitor $C_{CAL}$.

Figure 5A:
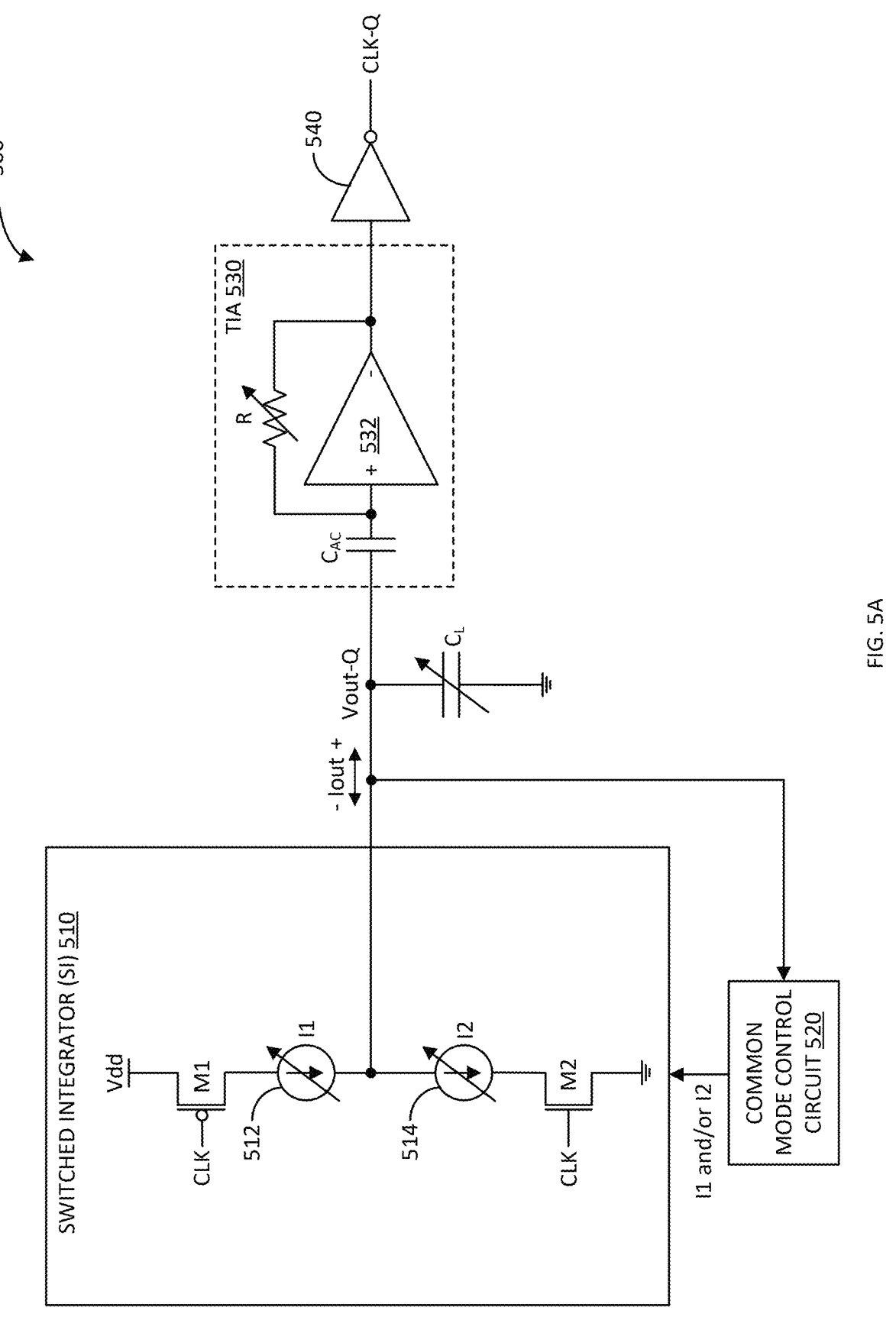
FIG. 5A illustrates a block diagram of an example quadrature-phase (Q) clock signal generator in accordance with another aspect of the disclosure.

FIG. 5A illustrates a block diagram of an example quadrature-phase (Q) clock signal generator 500 in accordance with another aspect of the disclosure. The quadrature-phase (Q) clock signal generator 500 may be an example implementation of the quadrature clock generating circuit of quadrature clock signal generator 400. That is, the quadrature-phase (Q) clock signal generator 500 includes a switched integrator 510, a load capacitor $C_L$ (e.g., which may have a variable capacitance), an optional common mode control circuit 520, a transimpedance amplifier (TIA) 530, and an inverter 540.

The switched integrator (SI) 510 includes a p-channel field effect transistor (PFET) M1, a first current source 512, a second current source 514, and an n-channel field effect transistor M2, all coupled in series between an upper voltage rail Vdd and a lower voltage rail (e.g., ground). That is, the PFET M1 includes a source coupled to the upper voltage rail Vdd and a gate configured to receive an input clock signal CLK. The first current source 512, which is configured to generate a first current I1, is coupled between a drain of the PFET M1 and an output of the switched integrator 510. The second current source 514, which is configured to generate a second current I2, is coupled between the output of the switched integrator 510 and a drain of the NFET M2. The NFET M2 includes a gate configured to receive the input clock signal CLK, and a source coupled to the lower voltage rail.

The load capacitor $C_L$ (e.g., which may be implemented as a dedicated capacitor or using parasitic capacitance) is coupled between the output of the switched integrator 510 and the lower voltage rail. The optional common mode control circuit 520 includes an input coupled to the output of the switched integrator 510 and an output coupled to one or both of the first and second current sources 512 and 514. The optional common mode control circuit 520 is configured to control one or both of the currents I1 or I2 to set a common mode voltage associated with a quadrature-phase output voltage Vout-Q.

The TIA 530 includes an alternating current (AC) coupling capacitor $C_{AC}$, an inverting amplifier 532, and a feedback resistor R (e.g., which may have a variable resistance). The AC coupling capacitor $C_{AC}$ is coupled between the output of the switched integrator 510 and an input (+) of the inverting amplifier 532. The feedback resistor R is coupled between an output (−) and the input (+) of the inverting amplifier 532. The inverter 540 includes an input coupled to the output of the TIA 530. The inverter 540 includes an output at which a quadrature-phase clock signal CLK-Q is generated. The operation of the quadrature-phase (Q) clock signal generator 500 is discussed further herein in connection with a related timing diagram.

Figure 5B:
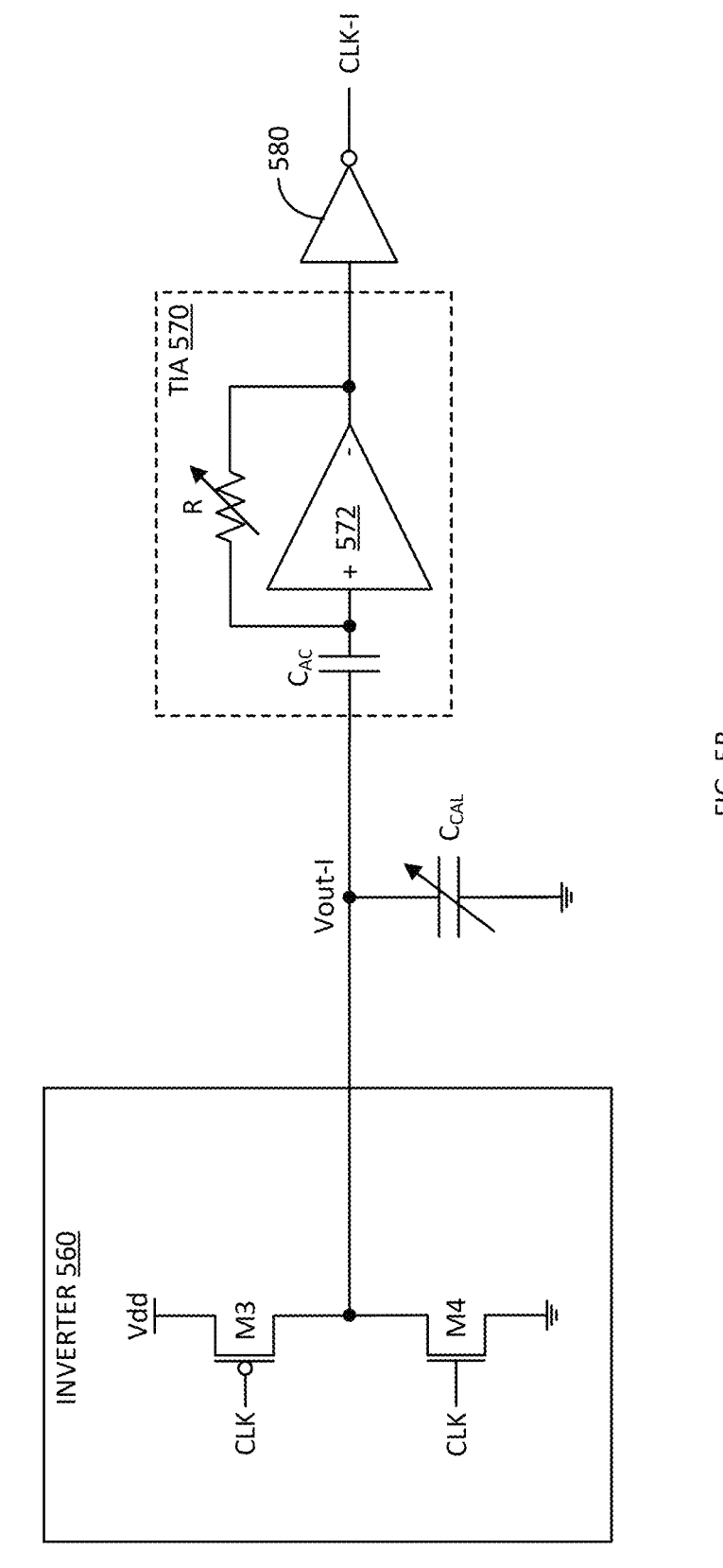
FIG. 5B illustrates a block diagram of an example in-phase (I) clock signal generator in accordance with another aspect of the disclosure.

FIG. 5B illustrates a block diagram of an example in-phase (I) clock signal generator 550 in accordance with another aspect of the disclosure. The in-phase (I) clock signal generator 550 may be an example implementation of the in-phase (I) clock generating circuit of quadrature clock signal generator 400. That is, the in-phase (I) clock signal generator 550 includes an inverter 560, a calibration capacitor $C_{CAL}$ (e.g., which may have a variable capacitance), a transimpedance amplifier (TIA) 570, and an inverter 580.

The inverter 560 includes a PFET M3 and an NFET M4 coupled in series between an upper voltage rail Vdd and a lower voltage rail (e.g., ground). That is, the PFET M3 includes a source coupled to the upper voltage rail Vdd, a gate configured to receive the input clock signal CLK, and a drain coupled to a drain of the NFET M4. The NFET M4 includes a gate configured to receive the input clock signal CLK, and a source coupled to the lower voltage rail. The calibration capacitor $C_L$ is coupled between the output of the inverter 560 (e.g., at the drains of PFET M3 and NFET M4) and the lower voltage rail.

The TIA 570 includes an AC coupling capacitor $C_{AC}$, an inverting amplifier 572, and a feedback resistor R (e.g., which may have a variable resistance). The AC coupling capacitor $C_{AC}$ is coupled between the output of the inverter 560 and an input (+) of the inverting amplifier 572. The feedback resistor R is coupled between an output (−) and the input (+) of the inverting amplifier 572. The inverter 580 includes an input coupled to the output of the TIA 570. The inverter 580 includes an output at which an in-phase clock signal CLK-I is generated. The operation of the in-phase (Q) clock signal generator 550 is discussed further herein in connection with the related timing diagram.

Figure 5C:
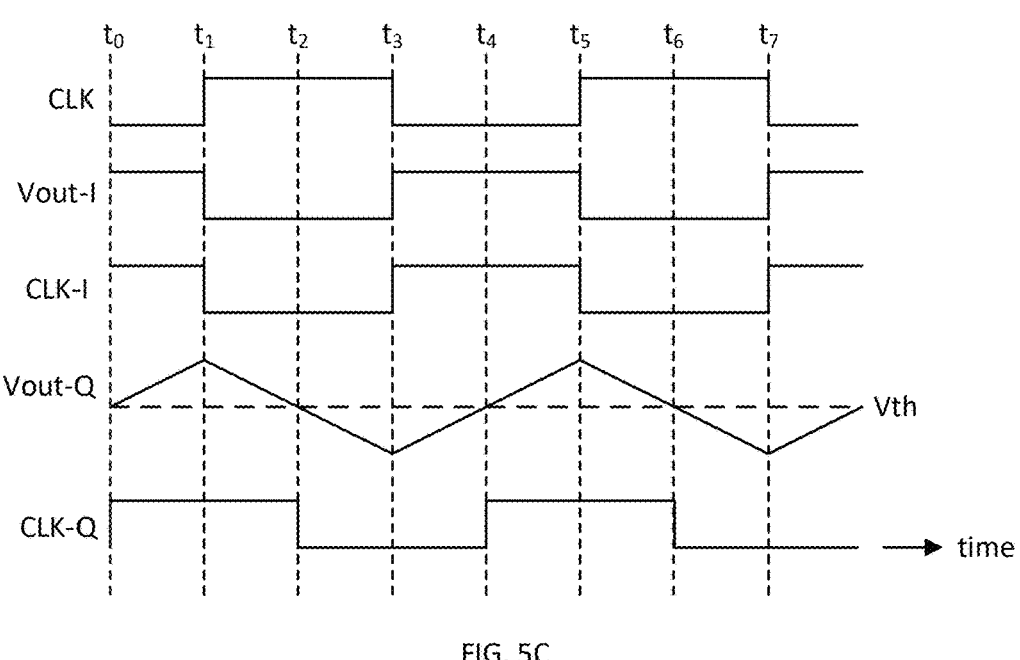
FIG. 5C illustrates a timing diagram of example signals associated with an operation of the quadrature (I/Q) clock signal generator of FIGS. 4 and 5A/5B in accordance with another aspect of the disclosure.

FIG. 5C illustrates a timing diagram of example signals associated with the operation of a quadrature clock signal generator 400 or 500/550 in accordance with another aspect of the disclosure. The horizontal axis represents time. The vertical axis, from top to bottom, represents the state or level of the input clock signal CLK, the in-phase (I) voltage Vout-I at the output of the inverter 410/550, the in-phase (I) clock signal CLK-I, the quadrature-phase (I) voltage Vout-Q at the output of the switched integrator 420/510, and the quadrature-phase (Q) clock signal CLK-Q.

According to the timing diagram, the inverter 410/550 inverts the input clock signal CLK to generate the in-phase (I) voltage Vout-I. The TIA 430/570 followed by the buffer/inverter 450/580 generates (e.g., copies and ensures rail-to-rail swing of) the in-phase (I) clock signal CLK-I based on the in-phase (I) voltage Vout-I.

With regard to the switched integrator 420/500, when the input clock signal CLK is at a low logic state (e.g., during time intervals $t_0$-$t_1$ and $t_3$-$t_5$), the PFET M1 is turned on and the NFET M2 is turned off. The PFET M1 being turned on enables the charging current source 512 to supply a charging current I1 to the load capacitor $C_L$. The NFET M2 being turned off disables the discharging current source 514. Accordingly, the charging current I1 causes the quadrature-phase (Q) voltage Vout-Q to increase at a substantially constant slope during time intervals $t_0$-$t_1$ and $t_3$-$t_5$.

When the input clock signal CLK is at a high logic state (e.g., during time intervals $t_1$-$t_3$ and $t_5$-$t_7$), the PFET M1 is turned off and the NFET M2 is turned on. The PFET M1 being turned off disables the charging current source 512. The NFET M2 being turned on enables the discharging current source 514 to draw a discharging current I2 from the load capacitor $C_L$. Accordingly, the discharging current I2 causes the quadrature-phase (Q) voltage Vout-Q to decrease at a substantially constant slope during time intervals $t_1$-$t_3$ and $t_5$-$t_7$.

Accordingly, the switched integrator 420/500 produces substantially a triangular wave quadrature-phase voltage Vout-Q with positive peaks at times $t_1$ and $t_5$ and negative peaks at times $t_3$ and $t_7$. The TIA 440/530 and buffer/inverter 460/540 convert the triangular wave quadrature-phase voltage Vout-Q into substantially a square wave quadrature-phase (Q) clock signal CLK-Q by comparing the voltage Vout-Q to a threshold voltage Vth. Thus, the quadrature-phase (Q) clock signal CLK-Q is at a high logic state during time intervals $t_0$-$t_1$ and $t_4$-$t_6$ (e.g., Vout-Q>Vth), and at a low logic state during time intervals $t_2$-$t_4$ and $t_6$-$t_7$ (e.g., Vout-Q<Vth). Note that a phase difference between the in-phase (I) clock signal CLK-I and the quadrature-phase (Q) clock signal CLK-Q is substantially 90 degrees.

Figure 6:
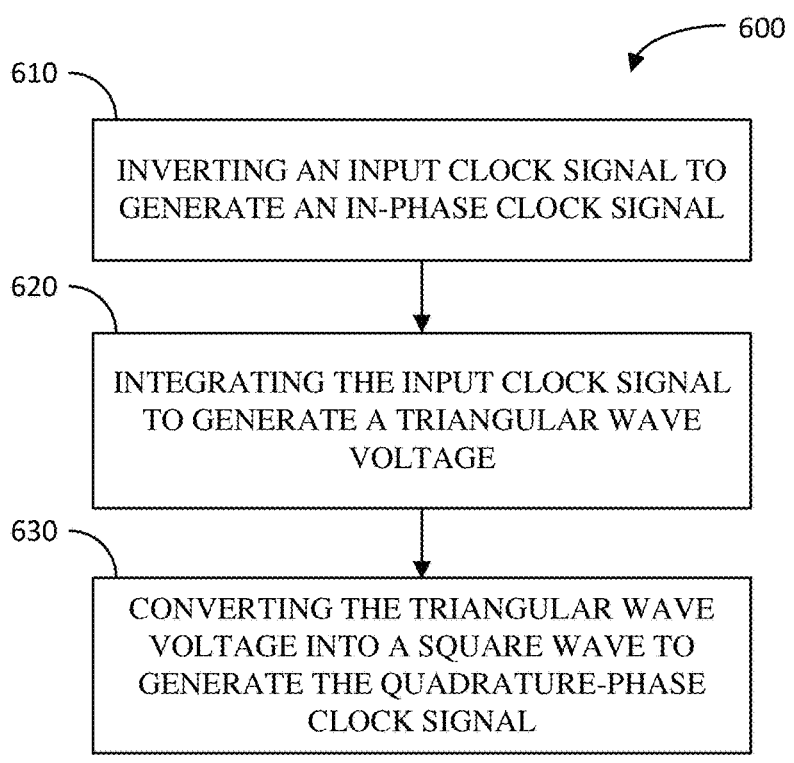
FIG. 6 illustrates a flow diagram of an example method of generating in-phase (I) and quadrature-phase (Q) clock signals in accordance with another aspect of the disclosure.

FIG. 6 illustrates a flow diagram of an example method 600 of generating clock signals in accordance with another aspect of the disclosure. The method 600 includes inverting an input clock signal to generate an in-phase clock signal (block 610). Examples of means for inverting an input clock signal to generate an in-phase clock signal include inverters 410 and 560.

The method 600 further includes integrating the input clock signal to generate a triangular wave voltage (block 620). Examples of means for integrating the input clock signal to generate a triangular wave voltage include switched integrators 420 and 510 and associated load capacitors $C_L$. Additionally, the method 600 includes converting the triangular wave voltage into a square wave to generate the quadrature-phase clock signal (block 630). Examples of means for converting the triangular wave voltage into a square wave to generate the quadrature-phase clock signal include TIAs 440 and 530.

The following provides an overview of aspects of the present disclosure:

Aspect 1: A clock signal generator, comprising: an in-phase clock generating circuit, comprising: an inverter configured to invert an input clock signal to generate a substantially square wave voltage; and a first transimpedance amplifier (TIA) configured to generate an in-phase clock signal based on the substantially square wave voltage; and a quadrature-phase clock generating circuit comprising: a load capacitor; a switched integrator configured to integrate the input clock signal to generate a substantially triangular wave voltage across the load capacitor; and a second transimpedance amplifier (TIA) configured to generate a quadrature-phase clock signal based on the substantially triangular wave voltage.

Aspect 2: The clock signal generator of aspect 1, wherein the switched integrator comprises: a p-channel field effect transistor (PFET); a first current source; a second current source; and an n-channel field effect transistor (NFET), wherein the PFET, the first current source, the second current source, and the NFET are coupled in series between an upper voltage rail and a lower voltage rail, wherein an output of the switched integrator is between the first current source and the second current source.

Aspect 3: The clock signal generator of aspect 2, wherein the load capacitor is coupled between the output of the switched integrator and the lower voltage rail.

Aspect 4: The clock signal generator of aspect 2 or 3, further comprising a common mode control circuit including an input coupled to the output of the switched integrator and at least one output coupled to one or both of the first current source or the second current source.

Aspect 5: The clock signal generator of any one of aspects 1-4, further comprising a calibration capacitor coupled between an output of the inverter and a lower voltage rail.

Aspect 6: The clock signal generator of any one of aspects 1-5, wherein the first TIA comprises: an inverting amplifier; an alternating current (AC) capacitor coupled between an output of the inverter and an input of the inverting amplifier; and a feedback resistor coupled between an output and the input of the inverting amplifier.

Aspect 7: The clock signal generator of any one of aspects 1-6, wherein the in-phase clock generating circuit further comprises one or more cascaded inverters or buffers including an input coupled to an output of the first TIA, wherein the one or more cascaded inverters or buffers are configured to generate the in-phase clock signal.

Aspect 8: The clock signal generator of any one of aspects 1-7, wherein the second TIA comprises: an inverting amplifier; an alternating current (AC) capacitor coupled between an output of the switched integrator and an input of the inverting amplifier; and a feedback resistor coupled between an output and the input of the inverting amplifier.

Aspect 9: The clock signal generator of any one of aspects 1-8, wherein the quadrature-phase clock generating circuit further comprises one or more cascaded inverters or buffers including an input coupled to an output of the second TIA, wherein the one or more cascaded inverters or buffers are configured to generate the quadrature-phase clock signal.

Aspect 10: A method of generating quadrature clock signals, comprising: inverting an input clock signal to generate an in-phase clock signal; integrating the input clock signal to generate a triangular wave voltage; and converting the triangular wave voltage into a square wave to generate a quadrature-phase clock signal.

Aspect 11: The method of aspect 10, wherein integrating the input clock signal comprises: supplying a charging current to a load capacitor to generate an increasing portion of the triangular wave voltage in response to a low logic state of the input clock signal; and drawing a discharging current from the load capacitor to generate a decreasing portion of the triangular wave voltage in response to a high logic state of the input clock signal.

Aspect 12: The method of aspect 11, further comprising calibrating the charging current and the discharging current based on a frequency of the input clock signal.

Aspect 13: The method of aspect 12, wherein calibrating the charging current and the discharging current based on the frequency of the input clock signal comprises increasing or decreasing the charging current and the discharging current in response to increasing or decreasing the frequency of the input clock signal, respectively.

Aspect 14: The method of any one of aspects 11-13, further comprising calibrating a capacitance of the load capacitor based on a frequency of the input clock signal.

Aspect 15: The method of aspect 14, wherein calibrating the capacitance of the load capacitor based on the frequency of the input clock signal comprises increasing or decreasing the capacitance of the load capacitor in response to decreasing or increasing the frequency of the input clock signal, respectively.

Aspect 16: The method of any one of aspects 10-15, further comprising tuning a calibration capacitor to adjust a phase of the in-phase clock signal so that a phase difference between the in-phase clock signal and the quadrature-phase clock signal is substantially 90 degrees.

Aspect 17: The method of anyone of aspects 10-16, wherein converting the triangular wave voltage into a square wave to generate the quadrature-phase clock signal comprises comparing the triangular wave voltage to a threshold.

Aspect 18: The method of any one of aspects 10-17, wherein converting the triangular wave voltage into a square wave to generate the quadrature-phase clock signal comprises amplifying the triangular wave voltage with a transimpedance gain.

Aspect 19: The method of claim 10, wherein inverting an input clock signal to generate an in-phase clock signal, comprises: generating a square wave voltage by inverting the input clock signal; and amplifying the square wave voltage with a transimpedance gain.

Aspect 20: The method of any one of aspects 10-19, further comprising: buffering the in-phase clock signal; and buffering the quadrature-phase clock signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A clock signal generator, comprising:
an in-phase clock generating circuit, comprising:
an inverter configured to invert an input clock signal to generate a substantially square wave voltage; and
a first transimpedance amplifier (TIA) configured to generate an in-phase clock signal based on the substantially square wave voltage; and
a quadrature-phase clock generating circuit comprising:
a load capacitor;
a switched integrator configured to integrate the input clock signal to generate a substantially triangular wave voltage across the load capacitor; and a second transimpedance amplifier (TIA) configured to generate a quadrature-phase clock signal based on the substantially triangular wave voltage.

2. The clock signal generator of claim 1, wherein the switched integrator comprises:
a p-channel field effect transistor (PFET);
a first current source;
a second current source; and
an n-channel field effect transistor (NFET), wherein the PFET, the first current source, the second current source, and the NFET are coupled in series between an upper voltage rail and a lower voltage rail, wherein an output of the switched integrator is between the first current source and the second current source.

3. The clock signal generator of claim 2, wherein the load capacitor is coupled between the output of the switched integrator and the lower voltage rail.

4. The clock signal generator of claim 2, further comprising a common mode control circuit including an input coupled to the output of the switched integrator and at least one output coupled to one or both of the first current source or the second current source.

5. The clock signal generator of claim 1, further comprising a calibration capacitor coupled between an output of the inverter and a lower voltage rail.

6. The clock signal generator of claim 1, wherein the first TIA comprises:
an inverting amplifier;
an alternating current (AC) capacitor coupled between an output of the inverter and an input of the inverting amplifier; and
a feedback resistor coupled between an output and the input of the inverting amplifier.

7. The clock signal generator of claim 1, wherein the in-phase clock generating circuit further comprises one or more cascaded inverters or buffers including an input coupled to an output of the first TIA, wherein the one or more cascaded inverters or buffers are configured to generate the in-phase clock signal.

8. The clock signal generator of claim 1, wherein the second TIA comprises:
an inverting amplifier;
an alternating current (AC) capacitor coupled between an output of the switched integrator and an input of the inverting amplifier; and
a feedback resistor coupled between an output and the input of the inverting amplifier.

9. The clock signal generator of claim 1, wherein the quadrature-phase clock generating circuit further comprises one or more cascaded inverters or buffers including an input coupled to an output of the second TIA, wherein the one or more cascaded inverters or buffers are configured to generate the quadrature-phase clock signal.

10. A method of generating quadrature clock signals, comprising:
inverting an input clock signal to generate an in-phase clock signal;
integrating the input clock signal to generate a triangular wave voltage; and
converting the triangular wave voltage into a square wave to generate a quadrature-phase clock signal.

11. The method of claim 10, wherein integrating the input clock signal comprises:
supplying a charging current to a load capacitor to generate an increasing portion of the triangular wave voltage in response to a low logic state of the input clock signal; and drawing a discharging current from the load capacitor to generate a decreasing portion of the triangular wave voltage in response to a high logic state of the input clock signal.

12. The method of claim 11, further comprising calibrating the charging current and the discharging current based on a frequency of the input clock signal.

13. The method of claim 12, wherein calibrating the charging current and the discharging current based on the frequency of the input clock signal comprises increasing or decreasing the charging current and the discharging current in response to increasing or decreasing the frequency of the input clock signal, respectively.

14. The method of claim 11, further comprising calibrating a capacitance of the load capacitor based on a frequency of the input clock signal.

15. The method of claim 14, wherein calibrating the capacitance of the load capacitor based on the frequency of the input clock signal comprises increasing or decreasing the capacitance of the load capacitor in response to decreasing or increasing the frequency of the input clock signal, respectively.

16. The method of claim 10, further comprising tuning a calibration capacitor to adjust a phase of the in-phase clock signal so that a phase difference between the in-phase clock signal and the quadrature-phase clock signal is substantially 90 degrees.

17. The method of claim 10, wherein converting the triangular wave voltage into a square wave to generate the quadrature-phase clock signal comprises comparing the triangular wave voltage to a threshold.

18. The method of claim 10, wherein converting the triangular wave voltage into a square wave to generate the quadrature-phase clock signal comprises amplifying the triangular wave voltage with a transimpedance gain.

19. The method of claim 10, wherein inverting an input clock signal to generate an in-phase clock signal, comprises:

generating a square wave voltage by inverting the input clock signal; and amplifying the square wave voltage with a transimpedance gain.

20. The method of claim 10, further comprising:
buffering the in-phase clock signal; and
buffering the quadrature-phase clock signal.

* * * * *